(12) United States Patent
Chang et al.

(10) Patent No.: US 7,649,263 B2
(45) Date of Patent: Jan. 19, 2010

(54) SEMICONDUCTOR DEVICE

(75) Inventors: Yu-Lan Chang, Kaohsiung (TW);
Chao-Ching Hsieh, Hsinchu Hsien (TW); Yi-Yiing Chiang, Taipei (TW);
Yi-Wei Chen, Taichung County (TW);
Tzung-Yu Hung, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/944,462

(22) Filed: Nov. 23, 2007

(65) Prior Publication Data
US 2008/0067684 A1 Mar. 20, 2008

Related U.S. Application Data

(63) Continuation of application No. 11/160,233, filed on Jun. 15, 2005, now Pat. No. 7,344,978.

(51) Int. Cl.
*H01L 23/48* (2006.01)
(52) U.S. Cl. .............. 257/768; 257/750; 257/754; 257/757; 257/763; 257/769; 257/770; 257/383; 257/384; 257/412; 257/E21.006
(58) Field of Classification Search ......... 257/750–757, 257/768–770, 775, E23.157, E23.162–E23.165
See application file for complete search history.

(56) References Cited

U.S. PATENT DOCUMENTS

| 5,874,331 | A | * | 2/1999 | Nishigohri | 438/231 |
| 6,150,249 | A | * | 11/2000 | Lee et al. | 438/592 |
| 6,251,779 | B1 | * | 6/2001 | Lu et al. | 438/682 |
| 6,482,739 | B2 | * | 11/2002 | Wu | 438/655 |
| 6,710,407 | B2 | * | 3/2004 | Yamamoto | 257/344 |
| 7,144,811 | B2 | * | 12/2006 | Liu et al. | 438/687 |

* cited by examiner

*Primary Examiner*—Jasmine J Clark
(74) *Attorney, Agent, or Firm*—Jianq Chyun IP Office

(57) ABSTRACT

A semiconductor device including at least one conductive structure is provided. The conductive structure includes a silicon-containing conductive layer, a refractory metal salicide layer and a protection layer. The refractory metal salicide layer is disposed over the silicon-containing conductive layer. The protection layer is disposed over the refractory metal salicide layer. Another semiconductor device including at least one conductive structure is also provided. The conductive structure includes a silicon-containing conductive layer, a refractory metal alloy salicide layer and a protection layer. The refractory metal alloy salicide layer is disposed over the silicon-containing conductive layer. The refractory metal alloy salicide layer is formed from a reaction of silicon of the silicon-containing conductive layer and a refractory metal alloy layer which includes a first refractory metal and a second refractory metal. The protection layer is disposed over the refractory metal alloy salicide layer.

11 Claims, 3 Drawing Sheets his is a continuation application of patent application Ser. No. 11/160,233, filed on Jun. 15, 2005 which is now allowed. The entirety of the above-mentioned patent application is hereby incorporated by reference herein and made a part of this specification.

BACKGROUND OF THE INVENTION

1. Field of the Invention

The present invention relates to a semiconductor device and a fabrication method thereof, and more particularly to a semiconductor device comprising at least one conductive structure which has a refractory metal salicide layer, and a fabrication method thereof.

2. Description of the Related Art

In semiconductor technology, a metal-oxide-semiconductor (MOS) transistor is composed of three electrodes: a gate, a source and a drain. The early MOS transistor is composed of a metal layer, a silicon oxide layer and a silicon substrate. However, most of metals have bad adhesion to silicon oxide. Polysilicon with good adhesion to silicon oxide is provided to replace the metal layer. Polysilicon, however, has high resistance. Even if being doped, resistance of doped polysilicon is still too high, and the doped polysilicon cannot replace the metal layer of the MOS transistor in this aspect. A solution is provided later. A metal salicide layer with a thickness similar to that of the polysilicon layer is disposed on the polysilicon layer. The low-resistance metal salicide layer and the polysilicon layer constitute a conductive layer.

Metal salicide has high melting point, thermal stability and low resistance so driving current and operational speed of the device are improved. Therefore, metal salicide technology gradually has been applied in integrated circuit processes. Additionally, due to the shrinkage of the integrated circuit technology, a gate width of a device is also reduced. If the metal salicide is titanium salicide, the narrow-line-width effect may occur. It means that if the line width is reduced, the sheet resistance of the gate dramatically increases. Therefore, other materials, such as cobalt salicide ($CoSi_2$) or nickel salicide ($NiSi_2$), have been used to replace titanium salicide.

Since nickel salicide has low resistance, low process temperature and minor narrow-line-width effect, it has been widely used in the 65-nm MOS field effect transistor (MOS-FET) technology. The thermal stability of nickel salicide, however, is poor. For the time being, nickel/platinum alloy salicide with high thermal stability has replaced nickel salicide.

Due to its high chemical stability, platinum is hard to be removed. Though a selected etch solution can remove nickel/platinum alloy, the etch solution may damage nickel/platinum alloy salicide. Accordingly, how to remove nickel/platinum alloy without damaging other parts of the device becomes an issue in this field.

SUMMARY OF THE INVENTION

Accordingly, the present invention is directed to a method of fabricating a semiconductor device. Before the etch process, a protection layer is formed over the metal alloy salicide layer, which effectively prevents damage of the metal alloy salicide layer.

The present invention is also directed to a semiconductor device. Its metal alloy salicide replaces the metal salicide of the prior art technology.

The present invention is further directed to a semiconductor device. Its metal salicide has low resistance, low process temperature and minor narrow-line-width effect.

The present invention provides a semiconductor device which comprises at least one conductive structure. The conductive structure comprises a silicon-containing conductive layer, a refractory metal salicide layer and a protection layer. The refractory metal salicide layer is disposed over the silicon-containing conductive layer. The protection layer is disposed over the refractory salicide layer.

According to the semiconductor device of an embodiment of the present invention, the material of the refractory metal salicide layer comprises nickel salicide, cobalt salicide, titanium salicide, molybdenum salicide, palladium salicide or platinum salicide.

According to the semiconductor device of an embodiment of the present invention, the material of the protection layer comprises refractory metal nitride, such as tantalum nitride, tungsten nitride, titanium nitride or molybdenum nitride.

According to the semiconductor device of an embodiment of the present invention, the thickness of the protection layer is from about 3 Å to 50 Å. The silicon-containing conductive layer comprises a gate, a source region, a drain region or a conductive line.

The present invention provides another semiconductor device. A refractory metal alloy salicide layer replaces the refractory metal salicide layer described above. The refractory metal alloy salicide is formed from a reaction of silicon of the silicon-containing conductive layer and a refractory metal alloy layer which comprises a first refractory metal and a second refractory metal.

According to the semiconductor device of an embodiment of the present invention, each of the first refractory metal and the second refractory metal is selected from at least a group consisting of nickel, cobalt, titanium, molybdenum, palladium and platinum.

According to the semiconductor device of an embodiment of the present invention, the second refractory metal is less than 10% weight of the refractory metal alloy layer.

The present invention also provides a method of fabricating a semiconductor device. First, a silicon-containing conductive layer is provided. A refractory metal alloy is then formed over the silicon-containing conductive layer, wherein the refractory metal alloy comprising a first refractory metal and a second refractory metal. A protection layer is formed over the refractory metal alloy layer. A thermal process is performed so that the refractory metal alloy reacts with silicon of the silicon-containing conductive layer to form a refractory metal alloy salicide layer. An etch process with an etch solution is performed. The etch solution removes the un-reacted refractory metal alloy layer and the protection layer thereon. A portion of the protection layer is left on the refractory metal alloy salicide layer.

According to the method of fabricating the semiconductor device of an embodiment of the present invention, the etch solution of the etch process comprises a mixed solution of nitric acid and hydrochloric acid, a mixed solution of sulfuric acid and ammonia hydroxide/hydrogen peroxide or a diluted hydrogen fluoride solution.

According to the method of fabricating the semiconductor device of an embodiment of the present invention, the thickness of the portion of the protection layer left over the refractory metal alloy salicide layer is from 3 Å to 50 Å. The silicon-containing conductive layer comprises a gate, a source region, a drain region or a conductive line.

According to the method of fabricating the semiconductor device of an embodiment of the present invention, the thermal process comprises a rapid thermal process (RTP).

According to the method of fabricating the semiconductor device of an embodiment of the present invention, a mixed solution of sulfuric acid and hydrogen peroxide (SPM) is further used to remove the portion of the protection layer left on the refractory metal alloy salicide layer after the etch process.

According to the method of fabricating the semiconductor device of an embodiment of the present invention, the silicon-containing conductive layer comprises a gate of a metal-oxide-semiconductor transistor, a silicon-containing doped region or a silicon-containing conductive line.

In the present invention, the refractory metal alloy salicide replaces the prior art refractory metal salicide so as to enhance the thermal stability of the metal salicide. In addition, the protection layer is formed over the refractory metal alloy salicide layer in the present invention. Since the protection layer on the refractory metal alloy layer and the protection layer on the refractory metal alloy salicide layer have different etch rates to the etch solution, the damage caused by the acid etch solution to the refractory metal alloy salicide layer is effectively avoided while the un-reacted refractory metal alloy layer is removed.

The above and other features of the present invention will be better understood from the following detailed description of the preferred embodiments of the invention that is provided in communication with the accompanying drawings.

DESCRIPTION OF SOME EMBODIMENTS

Following are descriptions of an embodiment of semiconductor device, for example, a metal-oxide-semiconductor (MOS) transistor. The present invention, however, is not limited thereto. The method of the present invention can be applicable to other silicon-containing structures.

Figure 1:
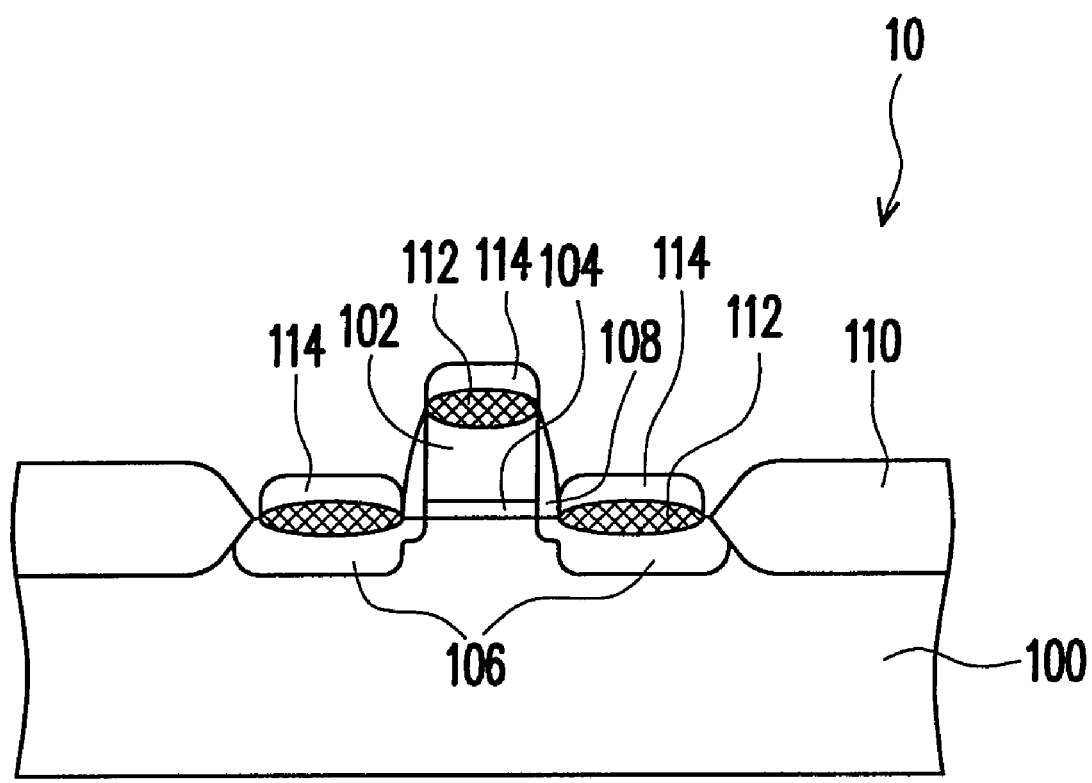
FIG. 1 is a cross sectional view showing a semiconductor device according to an embodiment of the present invention.

FIG. 1 is a cross sectional view showing a semiconductor device according to an embodiment of the present invention. Referring to FIG. 1, the semiconductor device 10 comprises a silicon substrate 100, a gate 102, a gate oxide layer 104, source/drain regions 106, spacers 108, isolation structures 110, a refractory metal salicide layer 112 and a protection layer 114. The gate 102 and the source/drain regions 106 are called silicon-containing conductive layers. The isolation structures 110 are disposed in the silicon substrate 100 to define an active area. The gate 102, the gate oxide layer 104, the source/drain regions 106, the spacers 108, the refractory metal salicide layer 112 and the protection layer 114 are within the active area. In addition, the gate oxide layer 104 is disposed over the silicon substrate 100. The gate 102 is disposed over the gate oxide layer 104. The source/drain regions 106 are disposed in the silicon substrate 100 adjacent to sidewalls of the gate 102. The spacers 108 are disposed on the sidewalls of the gate 102. The refractory metal salicide layer 112 is disposed over the gate 102 and the source/drain regions 106. The protection layer 114 is disposed over the refractory metal salicide layer 112.

In an embodiment, the material of the refractory metal salicide layer 112 can be, for example, nickel salicide, cobalt salicide, titanium salicide, molybdenum salicide, palladium salicide or platinum salicide. The material of the protection layer 114 can be, for example, refractory metal nitride, such as tantalum nitride, tungsten nitride, titanium nitride or molybdenum nitride. The thickness of the protection layer 114 is from about 3 Å to 50 Å.

In another embodiment, a refractory metal alloy salicide layer replaces the refractory metal salicide layer of the semiconductor device 10 described above. The refractory metal alloy salicide layer is formed from the reaction of silicon of the silicon-containing conductive layer and the refractory metal alloy layer which comprises a first refractory metal and a second refractory metal. Each of the first refractory metal and the second refractory metal is selected from at least a group consisting of nickel, cobalt, titanium, molybdenum, palladium and platinum, for example. In an embodiment, the first refractory metal is nickel and the second refractory metal is platinum, and the second refractory metal is less than 10% weight of the refractory metal alloy layer. By replacing the refractory metal salicide layer with the refractory metal alloy salicide layer, the thermal stability of the metal salicide layer is enhanced.

FIGS. 2A-2F are cross sectional views showing progress of a method of fabricating a semiconductor device according to an embodiment of the present invention. First, referring to FIG. 2A, a silicon substrate 200 is provided. Isolation structures 210 are formed in the silicon substrate 200 to define an active area. The isolation structures 210 can be, for example, a field oxide layer formed by LOCOS process or a shallow trench isolation (STI) structure formed by an STI process. An MOS transistor is then formed in the active area. The MOS transistor comprises a gate 202, a gate oxide layer 204 formed under the gate 202, and source/drain regions 206. In addition, spacers 208 are formed on sidewalls of the gate 202. The gate 202 and the source/drain regions 206 are called silicon-containing conductive layers.

Figure 2A:
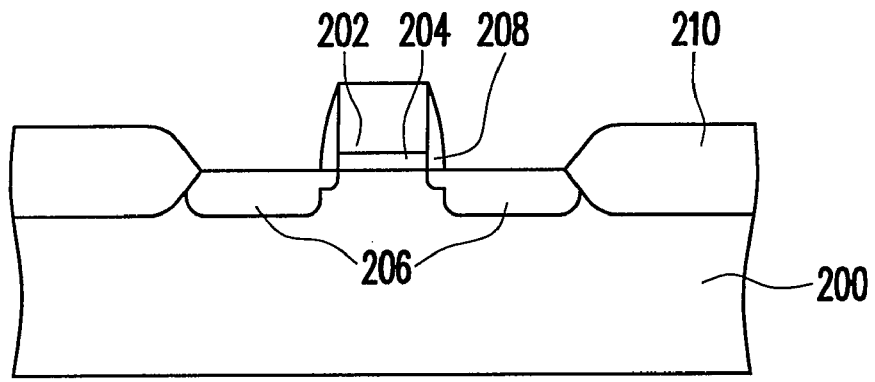
FIGS. 2A-2F are cross sectional views showing progress of a method of fabricating a semiconductor device according to an embodiment of the present invention.
Figure 2B:
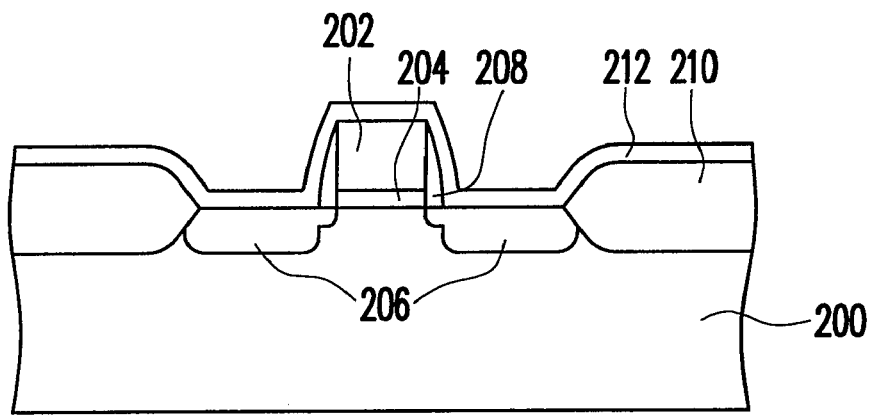

Referring to FIG. 2B, a refractory metal alloy layer 212 is formed over the substrate 200. The refractory metal alloy layer 212 comprises a first refractory metal and a second refractory metal. Each of the first refractory metal and the second refractory metal is selected from at least a group consisting of nickel, cobalt, titanium, molybdenum, palladium and platinum, for example. In this embodiment, the first refractory metal is nickel and the second refractory metal is platinum, and the second refractory metal is less than 10% weight of the refractory meal alloy layer 212.

Figure 2C:
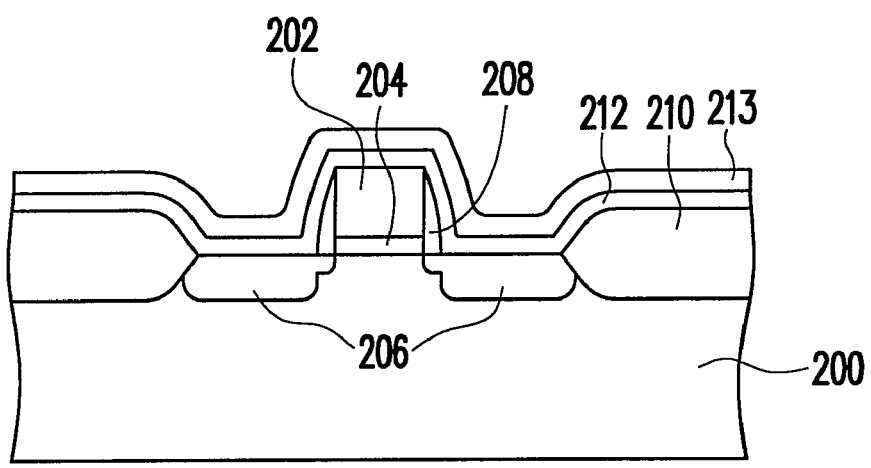

Referring to FIG. 2C, the protection layer 213 is formed over the refractory metal alloy layer 212. The material of the protection layer 213 can be, for example, refractory metal nitride, such as tantalum nitride, tungsten nitride, titanium nitride or molybdenum nitride.

Figure 2D:
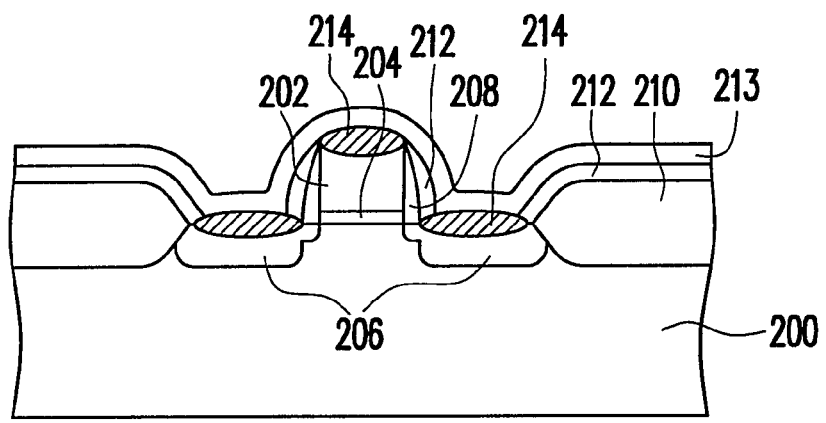

Referring to FIG. 2D, a thermal annealing process is performed so that the refractory metal alloy layer 212 react with silicon of the silicon-containing conductive layer and form the refractory metal alloy salicide layer 214. The thermal process can be, for example, a rapid thermal process (RTP). The refractory metal alloy layer 212 over the spacers 208 and the isolation structures 210 is not involved in the reaction.

Figure 2E:
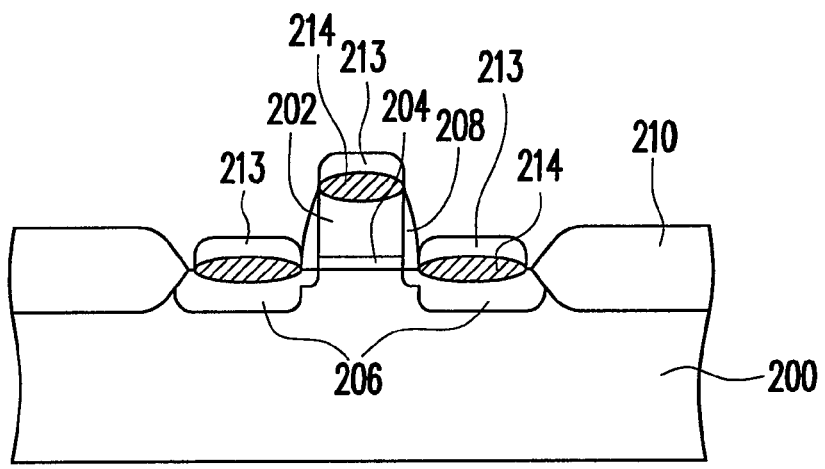

Referring to FIG. 2E, an etch process with an etch solution is performed. The etch solution has different etch rates to the protection layer 213 on the refractory metal alloy layer 212 and to the protection layer 213 over the refractory metal alloy salicide layer 214. Accordingly, the un-reacted refractory metal alloy layer 212 and the protection layer 213 thereon are removed, and a portion of the protection layer 213 is left on the refractory metal alloy salicide layer 214. The etch solution of the etch process comprises a mixed solution of nitric acid and hydrochloric acid, a mixed solution of sulfuric acid and ammonia hydroxide/hydrogen peroxide or a diluted hydrogen fluoride solution.

In an embodiment, the mole ratio of nitric acid/hydrochloric acid of the mixed solution is from 1/1 to 1/6. In a specific embodiment, the refractory metal alloy layer is a nickel and platinum alloy metal layer and protection layer is titanium nitride. The ratio nitric acid/hydrochloric acid of the mixed solution is about 1/3. If the titanium nitride protection layer 213 has a thickness about 150 Å, the etch process time is about 240 seconds.

Figure 2F:
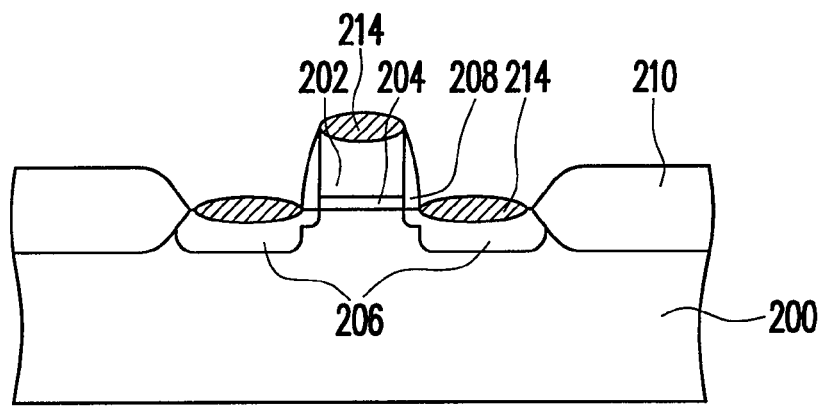

Referring to FIG. 2F, in another embodiment, the portion of the protection layer 213 left on the refractory metal alloy salicide layer 214 can be removed after the etch process. In one embodiment, a mixed solution of sulfuric acid and hydrogen peroxide (SPM) is used to remove the portion of the protection layer 213 left on the refractory metal alloy salicide layer 214.

Note that the present invention can be applicable to other silicon-containing structures, such as silicon-containing conductive lines. The method applied to a silicon-containing conductive line is similar to that applied to the above-mentioned MOS transistor. Detailed descriptions are not repeated.

In the present invention, the refractory metal alloy salicide replaces the prior art refractory metal salicide. After the formation of the refractory metal alloy salicide, the thermal stability of the metal salicide is enhanced. In addition, the protection layer is formed over the refractory metal alloy salicide layer in the present invention. Since the protection layer on the refractory metal alloy layer and the protection layer on the refractory metal alloy salicide layer have different etch rates to the etch solution, the un-reacted refractory metal with the high chemical stability is thus removed. As a result, the un-reacted refractory metal alloy layer and the protection layer thereon are completely removed. Therefore, the damage caused by the acid etch solution to the refractory metal alloy salicide layer is effectively avoided while the un-reacted refractory metal alloy layer is removed.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A semiconductor device, comprising at least one conductive structure, the conductive structure comprising:
   a silicon-containing conductive layer, wherein the silicon-containing conductive layer comprises a gate, a source region an a drain region;
   a refractory metal salicide layer, disposed over the silicon-containing conductive layer; and
   a protection layer, disposed over the refractory metal salicide layer on the gate, the source region and the drain region.

2. The semiconductor device of claim 1, wherein a material of the refractory metal salicide layer comprises nickel salicide, cobalt salicide, titanium salicide, molybdenum salicide, palladium salicide or platinum salicide.

3. The semiconductor device of claim 1, wherein a material of the protection layer comprises refractory metal nitride.

4. The semiconductor device of claim 3, wherein the refractory metal nitride comprises tantalum nitride, tungsten nitride, titanium nitride or molybdenum nitride.

5. The semiconductor device of claim 1, wherein a thickness of the protection layer is from about 3 Å to 50 Å.

6. A semiconductor device, comprising at least one conductive structure, the conductive structure comprising:
   a silicon-containing conductive layer, wherein the silicon-containing conductive layer comprises a gate, a source region and a drain region;
   a refractory metal alloy salicide layer, disposed over the silicon-containing conductive layer, the refractory metal alloy salicide layer being formed from a reaction of silicon of the silicon-containing conductive layer and a refractory metal alloy layer, wherein the refractory metal alloy layer comprises a first refractory metal and a second refractory metal; and
   a protection layer, disposed over the salicide layer on the gate, the source region and the drain region.

7. The semiconductor device of claim 6, wherein each of the first refractory metal and the second refractory metal is selected from at least a group consisting of nickel, cobalt, titanium, molybdenum, palladium and platinum.

8. The semiconductor device of claim 6, wherein the second refractory metal is less than 10% weight of the refractory metal alloy layer.

9. The semiconductor device of claim 6, wherein a material of the protection layer comprises refractory metal nitride.

10. The semiconductor device of claim 9, wherein the refractory metal nitride comprises tantalum nitride, tungsten nitride, titanium nitride or molybdenum nitride.

11. The semiconductor device of claim 6, wherein a thickness of the protection layer is from about 3 Å to 50 Å.

* * * * *